(12) United States Patent
Chien et al.

(10) Patent No.: US 9,070,860 B2
(45) Date of Patent: Jun. 30, 2015

(54) RESISTANCE MEMORY CELL AND OPERATION METHOD THEREOF

(75) Inventors: Wei-Chih Chien, Hsinchu (TW); Ming-Hsiu Lee, Hsinchu (TW)

(73) Assignee: MACRONIX International Co. Ltd., Hsinchu (TW)

( * ) Notice: Subject to any disclaimer, the term of this patent is extended or adjusted under 35 U.S.C. 154(b) by 464 days.

(21) Appl. No.: 13/601,209

(22) Filed: Aug. 31, 2012

(65) Prior Publication Data

US 2013/0343115 A1 Dec. 26, 2013

Related U.S. Application Data

(60) Provisional application No. 61/663,651, filed on Jun. 25, 2012.

(51) Int. Cl.
*H01L 45/00* (2006.01)
*G11C 13/00* (2006.01)
*G11C 29/50* (2006.01)

(52) U.S. Cl.
CPC ............ *H01L 45/08* (2013.01); *H01L 45/1206* (2013.01); *H01L 45/1233* (2013.01); *H01L 45/1286* (2013.01); *H01L 45/146* (2013.01); *G11C 29/50008* (2013.01); *G11C 2029/5002* (2013.01); *G11C 13/0007* (2013.01); *G11C 13/0069* (2013.01); *G11C 13/0097* (2013.01); *G11C 2213/72* (2013.01)

(58) Field of Classification Search
CPC ............. H01L 45/1206; H01L 45/122; H01L 45/1253; H01L 45/126; G11C 13/0007
See application file for complete search history.

(56) References Cited

U.S. PATENT DOCUMENTS

| | | | | |
|---|---|---|---|---|
| 7,522,446 B2 * | 4/2009 | Lee et al. | ....................... | 365/158 |
| 7,527,985 B2 * | 5/2009 | Lai et al. | ............................ | 438/3 |
| 7,829,930 B2 * | 11/2010 | Terao et al. | .................... | 257/314 |
| 7,867,815 B2 * | 1/2011 | Lung et al. | ..................... | 438/103 |
| 8,208,294 B2 * | 6/2012 | Happ et al. | ..................... | 365/163 |

* cited by examiner

*Primary Examiner* — Allison P Bernstein
(74) *Attorney, Agent, or Firm* — J.C. Patents

(57) ABSTRACT

A resistance memory cell is provided and includes a first electrode, a tungsten metal layer, a metal oxide layer, and a second electrode. The tungsten metal layer is disposed on the first electrode. The metal oxide layer is disposed on the tungsten metal layer. The second electrode includes a first connection pad, a second connection pad, and a bridge portion electrically connected between the first connection pad and the second connection pad. The bridge portion is disposed on the metal oxide layer or surrounds the metal oxide layer. The resistance memory cell adjusts a resistivity of the metal oxide layer through a first current path, passing through the metal oxide layer and the tungsten metal layer, or a second current path extending from the first connection pad to the second connection pad.

8 Claims, 8 Drawing Sheets

RESISTANCE MEMORY CELL AND OPERATION METHOD THEREOF

CROSS-REFERENCE TO RELATED APPLICATION

This application claims the priority benefit of U.S. provisional application Ser. No. 61/663,651, filed on Jun. 25, 2012. The entirety of the above-mentioned patent application is hereby incorporated by reference herein and made a part of this specification.

BACKGROUND OF THE INVENTION

1. Field of the Invention

The invention relates to a memory cell and an operation method thereof, and more particularly relates to a resistance memory cell and an operation method thereof.

2. Description of Related Art

A resistance memory has the advantages of low operation voltage, fast operation speed, simplified structure, and good durability, etc. and thus has become the most potential memory type in recent years. Generally speaking, the operation modes for switching the storage status of the resistance memory include unipolar switching and bipolar switching. Specifically, in the operation mode of unipolar switching, voltage pulses with the same polarity (e.g. positive voltage pulse or negative voltage pulse) are used to perform a programming operation and an erasing operation of the memory cell. In the operation mode of bipolar switching, voltage pulses with different polarities are used to respectively perform the programming operation and the erasing operation of the memory cell.

Besides, in the operation mode of unipolar switching, it needs to increase the amplitude and the pulse time of the voltage pulse to erase the memory cell in the conventional resistance memory. However, such a method tends to cause greater current stress during the erasing operation of the memory cell and results in device degradation and reduces reliability of the memory. Moreover, in the operation mode of bipolar switching, each memory cell of the resistance memory needs to be connected in series to a switch composed of a transistor for controlling the timing of switching the storage status of each memory cell. However, the layout of transistors requires a larger area, and as a result, the resistance memory may not be used to achieve a high-density memory array.

SUMMARY OF THE INVENTION

The invention provides a resistance memory cell which forms a second current path not passing through a metal oxide layer by a second electrode and switches a storage status of the resistance memory cell through the second current path. Accordingly, the problem of device degradation is prevented and a high-density memory array is achieved.

The invention provides an operation method of a resistance memory cell for setting the resistance memory cell to a low resistance state through a second current path not passing through a metal oxide layer. Accordingly, the problem of device degradation is prevented and reliability of a memory is improved.

The invention provides a resistance memory cell which includes a first electrode, a tungsten metal layer, a metal oxide layer, and a second electrode. The tungsten metal layer is disposed on the first electrode. The metal oxide layer is disposed on the tungsten metal layer. The second electrode includes a first connection pad, a second connection pad, and a bridge portion electrically connected between the first connection pad and the second connection pad. The bridge portion is disposed on the metal oxide layer or surrounds the metal oxide layer. The resistance memory cell adjusts a resistivity of the metal oxide layer through a first current path, passing through the metal oxide layer and the tungsten metal layer, or a second current path extending from the first connection pad to the second connection pad.

In an embodiment of the invention, the resistance memory cell increases the resistivity of the metal oxide layer through the first current path.

In an embodiment of the invention, the resistance memory cell generates a heat source through the second current path and reduces the resistivity of the metal oxide layer by the heat source.

In an embodiment of the invention, when the bridge portion is disposed on the metal oxide layer, the first connection pad is used for receiving a programming pulse or an erasing pulse, and one of the first electrode and the second connection pad is electrically connected to a ground end.

In an embodiment of the invention, when the bridge portion surrounds the metal oxide layer, the resistance memory cell further includes a connection layer and a third electrode. The connection layer is disposed on the metal oxide layer, and the metal oxide layer is disposed in an opening of the bridge portion. The third electrode is disposed on the connection layer.

The invention provides an operation method of a resistance memory cell, wherein the resistance memory cell includes a first electrode, a tungsten metal layer disposed on the first electrode, a metal oxide layer disposed on the tungsten metal layer, and a second electrode which includes a first connection pad, a bridge portion, and a second connection pad. The operation method of the resistance memory cell includes: adjusting a resistivity of the metal oxide layer through a first current path, passing through the metal oxide layer and the tungsten metal layer, or a second current path extending from the first connection pad to the second connection pad, wherein the bridge portion is electrically connected between the first connection pad and the second connection pad, and the bridge portion is disposed on the metal oxide layer or surrounds the metal oxide layer.

In an embodiment of the invention, the step of adjusting the resistivity of the metal oxide layer through the first current path, passing through the metal oxide layer and the tungsten metal layer, or the second current path extending from the first connection pad to the second connection pad includes: increasing the resistivity of the metal oxide layer through the first current path when programming the resistance memory cell; and generating a heat source through the second current path and reducing the resistivity of the metal oxide layer by the heat source when erasing the resistance memory cell.

In an embodiment of the invention, when the bridge portion is disposed on the metal oxide layer, the step of increasing the resistivity of the metal oxide layer through the first current path includes: electrically connecting the first electrode to the ground end; and providing a programming pulse to the first connection pad.

In an embodiment of the invention, when the bridge portion surrounds the metal oxide layer, the resistance memory cell further includes a connection layer disposed on the metal oxide layer and a third electrode disposed on the connection layer, and the step of increasing the resistivity of the metal oxide layer through the first current path includes: electrically connecting the first electrode to the ground end; and providing the programming pulse to the third electrode.

In an embodiment of the invention, the step of generating the heat source through the second current path includes: electrically connecting the second connection pad to the ground end; and providing an erasing pulse to the first connection pad.

Based on the above, the invention uses the second electrode in the resistance memory cell to form the second current path that does not pass through the metal oxide layer. Accordingly, the first current path that passes through the metal oxide layer is used to reset the metal oxide layer to the high resistance state and the second current path that does not pass through the metal oxide layer is used to set the metal oxide layer to the low resistance state. Since the second current path does not pass through the metal oxide layer, device degradation is prevented and reliability of the memory is improved. Moreover, the resistance memory cell of the invention is conducive to achieving a high-density memory array.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
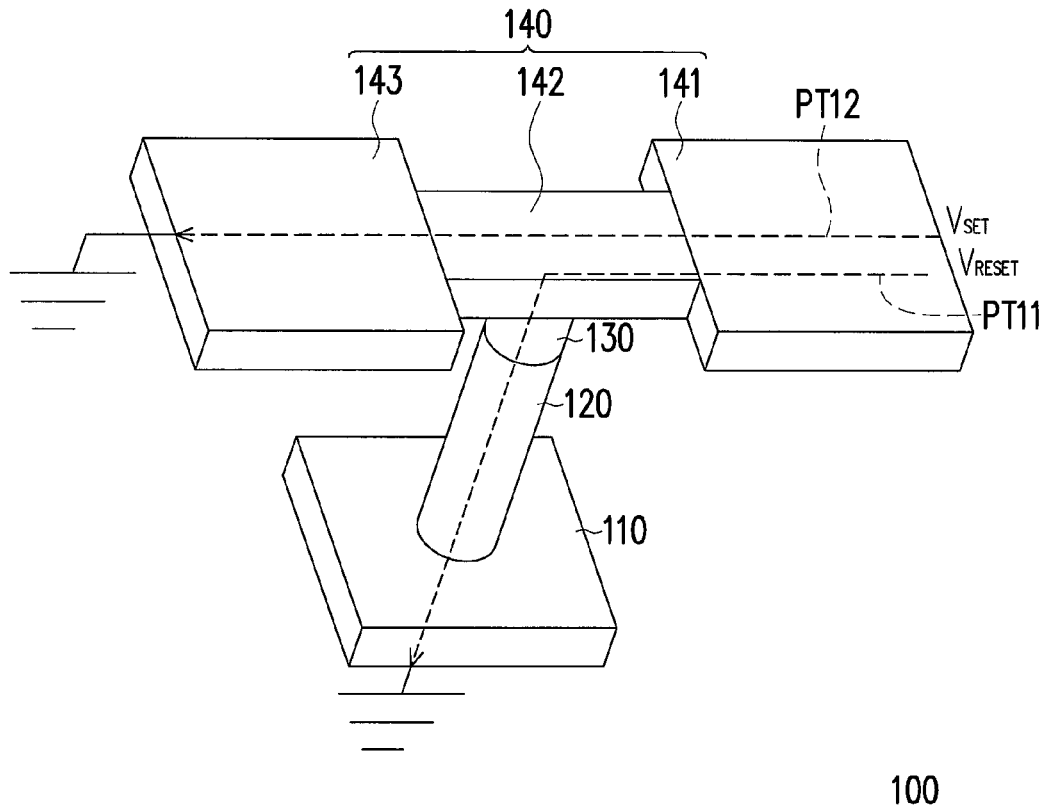
FIG. 1 is a schematic diagram showing a structure of a resistance memory cell according to an exemplary embodiment of the invention.

FIG. 1 is a schematic diagram showing a structure of a resistance memory cell according to an exemplary embodiment of the invention. As shown in FIG. 1, a resistance memory cell 100 includes a first electrode 110, a tungsten metal layer 120, a metal oxide layer 130, and a second electrode 140. The second electrode 140 includes a first connection pad 141, a bridge portion 142, and a second connection pad 143. Specifically, an oxide in the metal oxide layer 130 may be tungsten oxide (WOx), tantalum oxide (TaOx), hafnium oxide (HfOx), titanium oxide (TiOx), copper oxide (CuOx), nickel oxide (NiOx), or zinc oxide (ZnOx), for example. In terms of configuration, the tungsten metal layer 120 is disposed on the first electrode 110. The metal oxide layer 130 is disposed on the tungsten metal layer 120. Moreover, the bridge portion 142 is electrically connected between the first connection pad 141 and the second connection pad 142 and is disposed on the metal oxide layer 130.

In terms of operation, the resistance memory cell 100 adjusts a resistivity of the metal oxide layer 130 through a first current path PT11, passing through the metal oxide layer 130 and the tungsten metal layer 120, or a second current path PT12 extending from the first connection pad 141 to the second connection pad 142, so as to switch a storage status of the resistance memory cell 100. In addition, during the switching of the storage status of the resistance memory cell 100, the first connection pad 141 is used for receiving a programming pulse $V_{RESET}$ or an erasing pulse $V_{SET}$. One of the first electrode 110 and the second connection pad 143 is electrically connected to a ground end.

Figure 2:
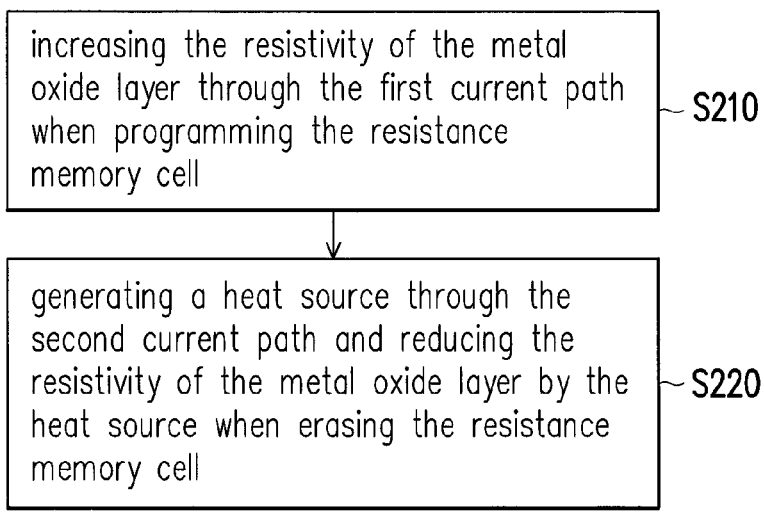
FIG. 2 is a flowchart illustrating an operation method of a resistance memory cell according to an exemplary embodiment of the invention.

For instance, FIG. 2 is a flowchart illustrating an operation method of a resistance memory cell according to an exemplary embodiment of the invention. Please refer to both FIG. 1 and FIG. 2. As shown in Step S210 of FIG. 2, during a process of programming the resistance memory cell 100, oxygen ions are accumulated on a surface of the metal oxide layer 130 through the first current path PT11 to increase the resistivity of the metal oxide layer 130. That is, the metal oxide layer 130 is changed from a low resistance state (LRS) to a high resistance state (HRS), and this process is called a reset operation.

Moreover, as shown in Step S220 of FIG. 2, during a process of erasing the resistance memory cell 100, a heat source is generated through the second current path PT12. Due to the heat source, the oxygen ions accumulated on the surface of the metal oxide layer 130 move downward, which reduces the resistivity of the metal oxide layer 130. That is, the metal oxide layer 130 is changed from the high resistance state to the low resistance state, and this process is also called a set operation. It is noted that the second current path PT12 passes through the bridge portion 142, and the bridge portion 142 is close to the metal oxide layer 130. Therefore, in the actual operation, the bridge portion 142 is equivalent to a heater that continuously supplies heat to the metal oxide layer 130.

Figure 3A:
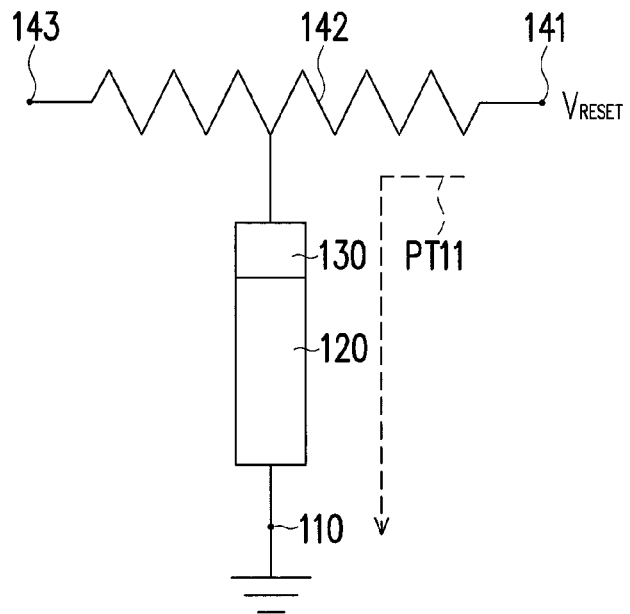
FIG. 3A and FIG. 3B are equivalent diagrams of the resistance memory cell of FIG. 1.
Figure 3B:
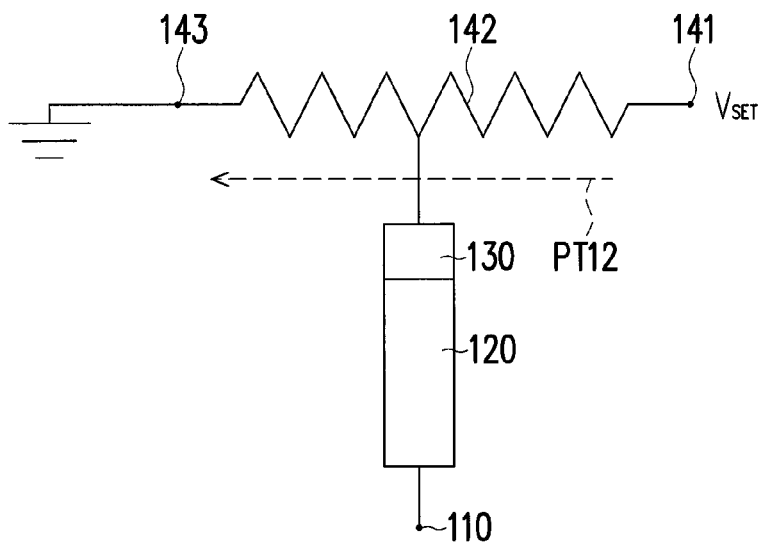
Figure 4:
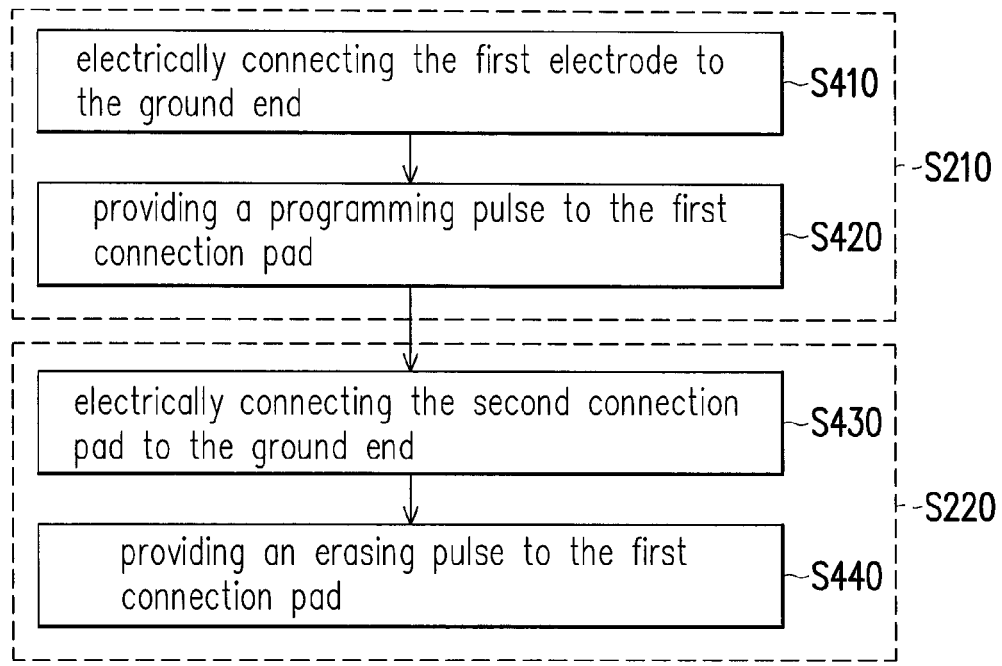
FIG. 4 is a flowchart illustrating details of an operation method of a resistance memory cell according to an exemplary embodiment of the invention.

For example, FIG. 3A and FIG. 3B are equivalent diagrams of the resistance memory cell of FIG. 1, wherein the bridge portion 142 is particularly denoted by a resistor symbol in FIG. 3A and FIG. 3B. FIG. 4 is a flowchart illustrating details of an operation method of a resistance memory cell according to an exemplary embodiment of the invention. Please refer to FIG. 3A, FIG. 3B, and FIG. 4.

In regard to the detailed processes of programming the resistance memory cell 100, i.e. details of Step S210, as shown in Step S410, the first electrode 110 is electrically connected to the ground end, and the second connection pad 143 is in a floating status. In addition, as shown in Step S420, the programming pulse $V_{RESET}$ is provided to the first connection pad 141. Accordingly, the first current path PT11 that passes through the metal oxide layer 130 and the tungsten metal layer 120 is formed, so as to perform the programming operation (i.e. reset operation) on the resistance memory cell 100.

Further, in regard to the detailed processes of erasing the resistance memory cell 100, i.e. details of Step S220, as shown in Step S430, the first electrode 110 is in the floating status while the second connection pad 143 is electrically connected to the ground end. As illustrated in Step S430, the erasing pulse $V_{SET}$ is provided to the first connection pad 141. According to the above, the second current path PT12 that extends from the first connection pad 141 to the second connection pad 142 is formed, so as to perform the erasing operation (i.e. set operation) on the resistance memory cell 100.

It is worth mentioning that the programming pulse $V_{RESET}$ is for example a positive voltage pulse, and the erasing pulse $V_{SET}$ is for example a positive voltage pulse or a negative voltage pulse. In other words, the voltage polarities of the programming pulse $V_{RESET}$ and the erasing pulse $V_{SET}$ may be the same or different. Thus, the resistance memory cell 100 is suitable for both the operation modes of unipolar switching and bipolar switching.

Figure 5:
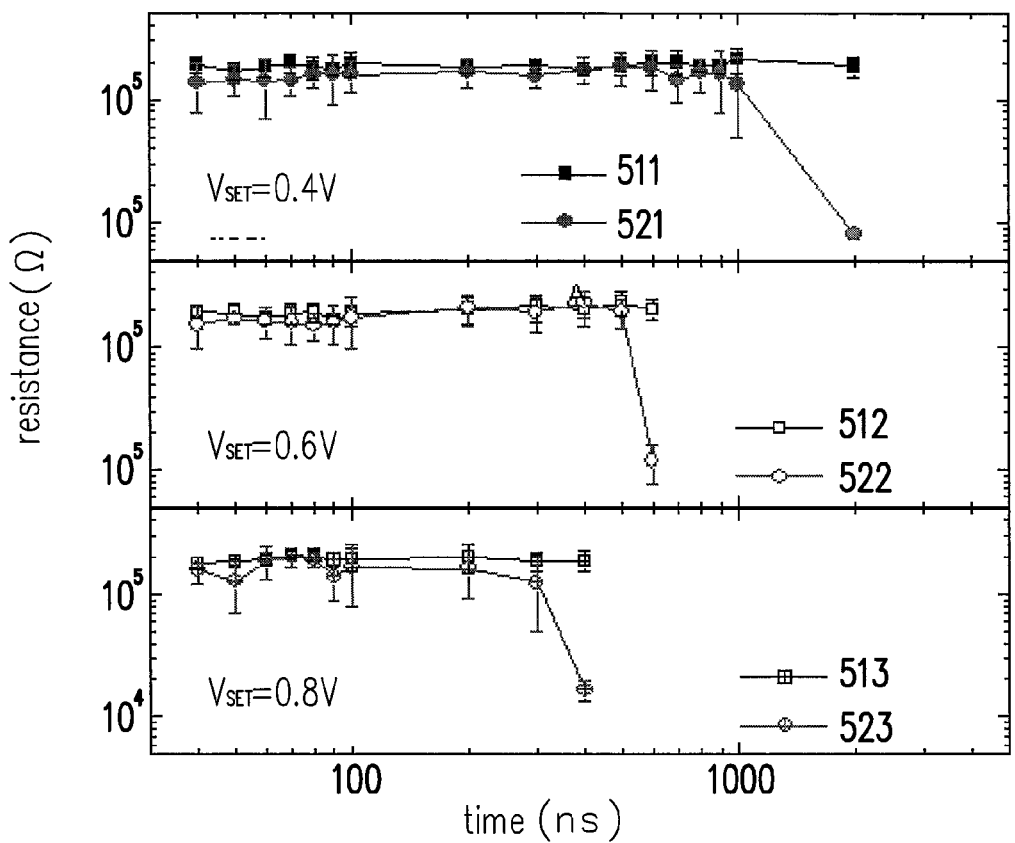
FIG. 5 to FIG. 7 are simulation data diagrams of the resistance memory cell according to an exemplary embodiment of the invention.
Figure 6:
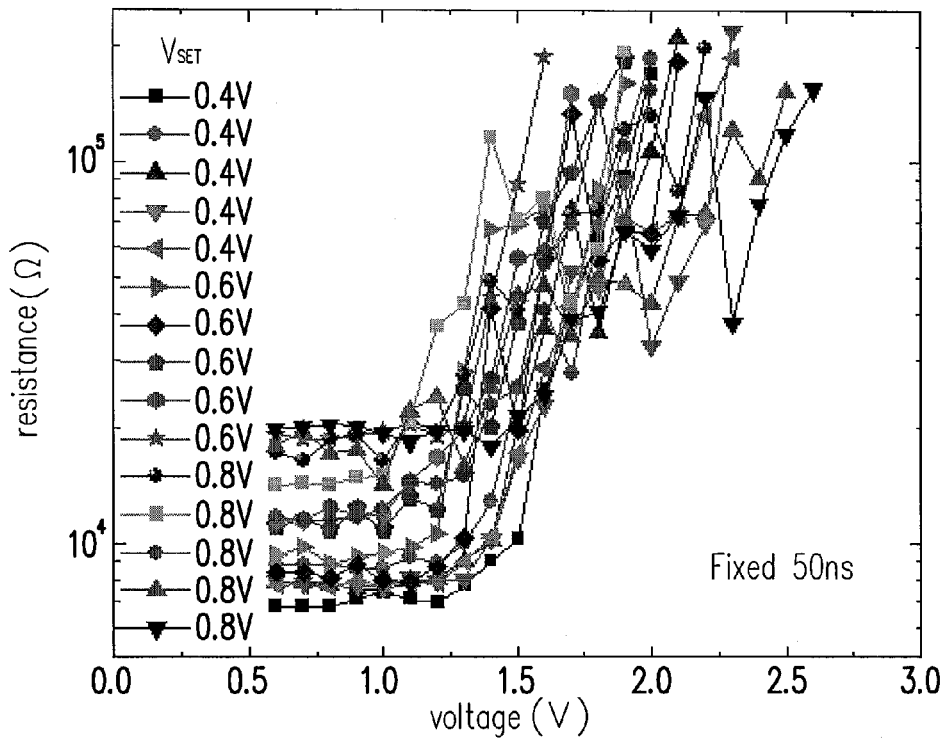
Figure 7:
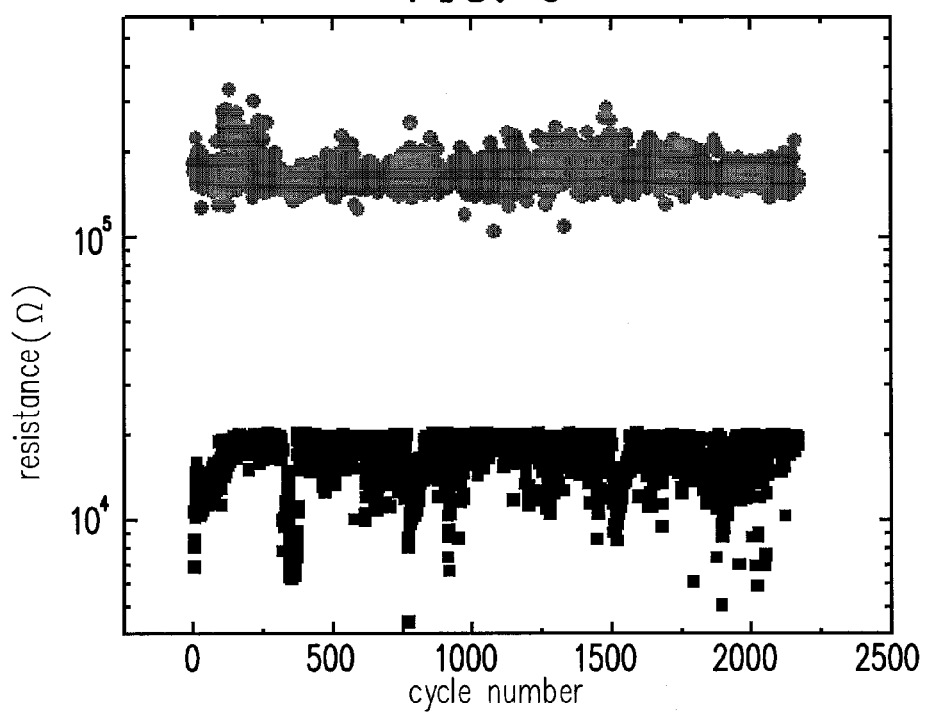

Further to the above, FIG. 5 to FIG. 7 are simulation data diagrams of the resistance memory cell according to an exemplary embodiment of the invention. As shown in FIG. 5, curves 511-513 respectively represent the change of a resistance value of a conventional resistance memory under the erasing operation, and curves 521-523 respectively represent the change of a resistance value of the resistance memory cell 100 under the erasing operation. According to FIG. 5, when the erasing pulse $V_{SET}$ is raised to 0.8V, the conventional resistance memory still cannot perform the erasing operation. By contrast, the resistance memory cell 100 can perform the erasing operation when the erasing pulse $V_{SET}$ is equal to 0.4V, 0.6V, or 0.8V, and the erasing time are 2 us, 600 ns, and 400 ns respectively.

Moreover, the curves of FIG. 6 show the relationship between the programming pulse and the resistance value of the resistance memory cell 100 under the programming operation, and the curves respectively correspond to different erasing statuses. According to FIG. 6, the resistance memory cell 100 is successfully reset to the high resistance state no matter what the erasing status of the resistance memory cell 100 is (e.g. the resistance memory cell 100 uses the erasing pulse $V_{SET}$ of 0.4V, 0.6V, or 0.8V for erasing). Furthermore, FIG. 7 illustrates the result of a durability test on the resistance memory cell 100, which uses the programming pulse $V_{RESET}$ of 2V (pulse voltage) for 50 ns (pulse time) and the erasing pulse $V_{SET}$ of 0.4V (pulse voltage) for 1 us (pulse time). According to FIG. 7, the resistance memory cell 100 can be changed between high and low resistances for more than 1K times, which proves that the resistance memory cell 100 has favorable durability.

Figure 8:
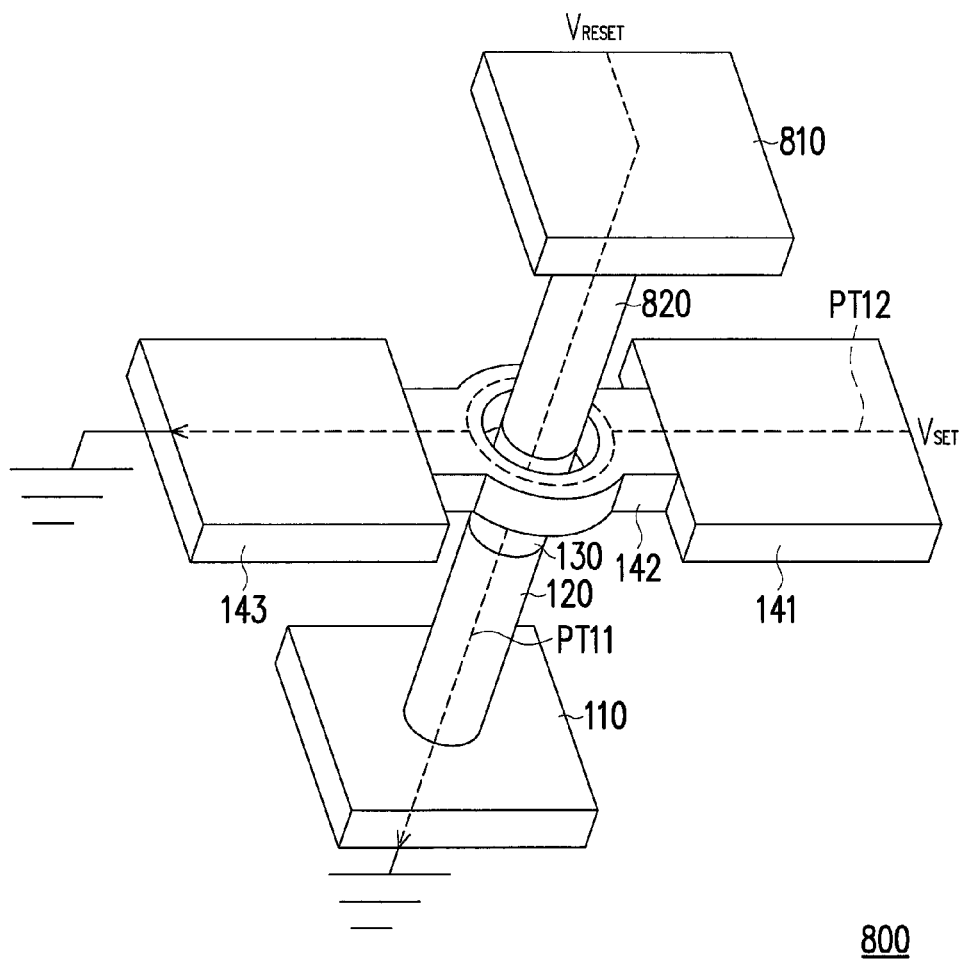
FIG. 8 is a schematic diagram showing a structure of a resistance memory cell according to another exemplary embodiment of the invention.

It should be noted that although the embodiment of FIG. 1 has specified where the bridge portion 142 is located, the invention is not limited thereto. For example, FIG. 8 is a schematic diagram showing a structure of a resistance memory cell according to another exemplary embodiment of the invention. Similar or identical elements in FIG. 1 and FIG. 8 are denoted by the same reference numbers and names. With reference to FIG. 8, the bridge portion 142 of a resistance memory cell 800 has an opening, and the metal oxide layer 130 is disposed in the opening of the bridge portion 142. That is, the bridge portion 142 of FIG. 8 is disposed around the metal oxide layer 130 or surrounds a sidewall of the metal oxide layer 130. Compared with FIG. 1, the resistance memory cell 800 further includes a third electrode 810 and a connection layer 820. More specifically, the connection layer 820 is disposed on the metal oxide layer 130, and the third electrode 810 is disposed on the connection layer 820.

In terms of operation, an operation method of the resistance memory cell 800 is similar to the operation method of the embodiment of FIG. 1, which is shown in FIG. 2. For example, as shown in Step S210 of FIG. 2, during the process of programming the resistance memory cell 800, oxygen ions are accumulated on the surface of the metal oxide layer 130 through the first current path PT11, so as to change the resistance memory cell 800 from the low resistance state to the high resistance state. Further, as shown in Step S220 of FIG. 2, during the process of erasing the resistance memory cell 800, the oxygen ions accumulated on the surface of the metal oxide layer 130 move downward due to the heat source generated by the second current path PT12, so as to change the metal oxide layer 130 from the high resistance state to the low resistance state. In other words, the resistance memory cell 800 adjusts the resistivity of the metal oxide layer 130 through the first current path PT11, passing through the metal oxide layer 130 and the tungsten metal layer 120, or the second current path PT12 extending from the first connection pad 141 to the second connection pad 142.

A main difference between the embodiments of FIG. 1 and FIG. 8 lies in that: the second electrode 140 in FIG. 1 is electrically connected to the metal oxide layer 130 via the bridge portion 142; and since the second electrode 140 is shared, the first connection pad 141 is used to receive the stylizing pulse $V_{RESET}$ or the erasing pulse $V_{SET}$. However, in the embodiment of FIG. 8, the bridge portion 142 is disposed around the metal oxide layer 130 or surrounds the sidewall of the metal oxide layer 130. That is to say, the second electrode 140 is not electrically connected to the metal oxide layer 130. Therefore, in the embodiment of FIG. 8, the resistance memory cell 800 respectively receives the programming pulse $V_{RESET}$ and the erasing pulse $V_{SET}$ through the third electrode 810 and the first connection pad 141 of the second electrode 140.

Figure 9A:
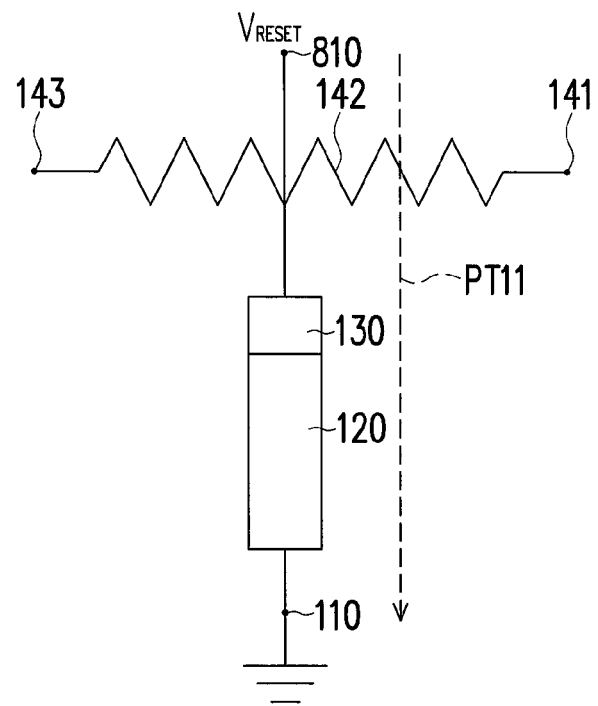
FIG. 9A and FIG. 9B are equivalent diagrams of the resistance memory cell of FIG. 8.
Figure 9B:
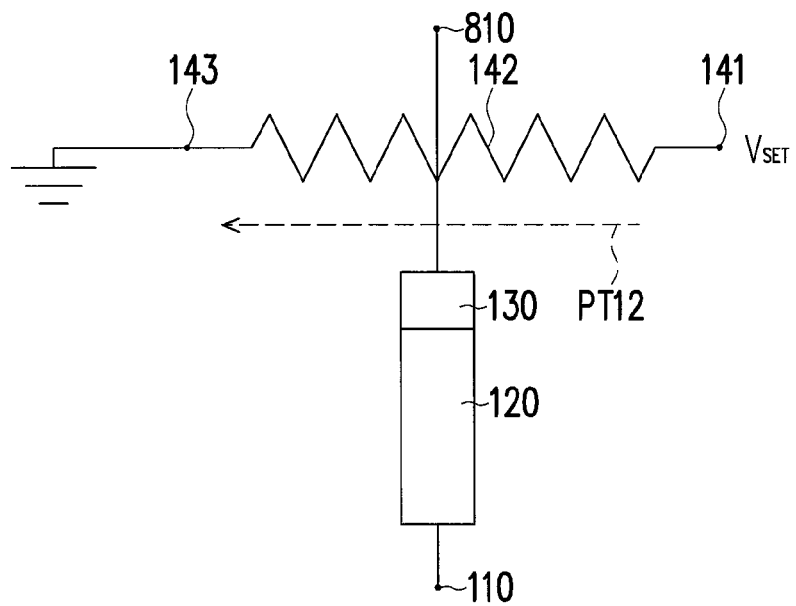
Figure 10:
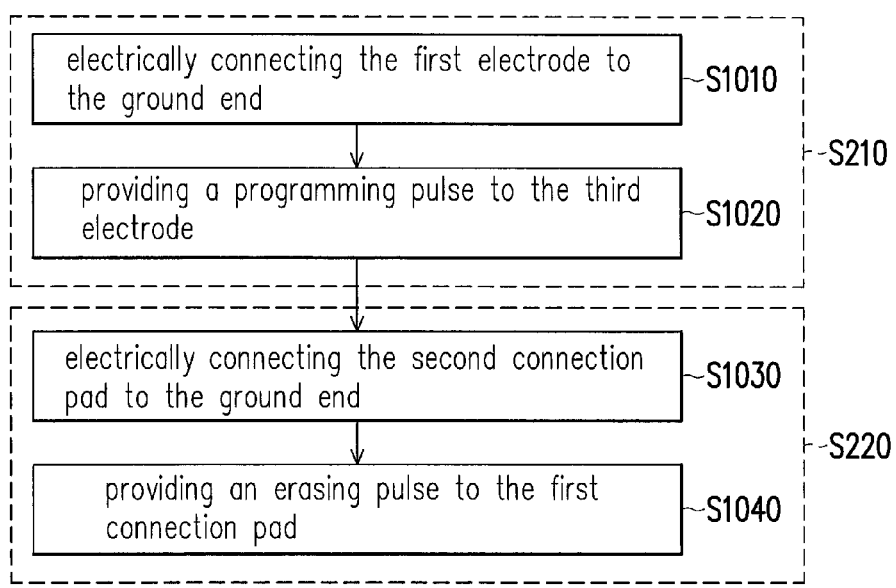
FIG. 10 is a flowchart illustrating details of an operation method of a resistance memory cell according to another exemplary embodiment of the invention.

For example, FIG. 9A and FIG. 9B are equivalent diagrams of the resistance memory cell of FIG. 8, and FIG. 10 is a flowchart illustrating details of the operation method of a resistance memory cell according to another exemplary embodiment of the invention. Please refer to FIG. 9A, FIG. 9B, and FIG. 10 for the detailed operation of the resistance memory cell 800.

In regard to the detailed processes of programming the resistance memory cell 800, as shown in Step S1010, the first electrode 110 is electrically connected to the ground end, and the second connection pad 143 is in the floating status. In addition, as shown in Step S1020, the programming pulse $V_{RESET}$ is provided to the third electrode 810. Accordingly, the first current path PT11 that passes through the metal oxide layer 130 and the tungsten metal layer 120 is formed, so as to perform the programming operation (i.e. reset operation) on the resistance memory cell 800. The detailed processes of the erasing operation of the resistance memory cell 800 are the same as those of the resistance memory cell 100 of FIG. 1. That is, as shown in Step S1030 and Step S1040, in the erasing operation, the second connection pad 143 is electrically connected to the ground end, and the first connection pad 141 is used for receiving the erasing pulse $V_{SET}$. Accordingly, the second current path PT12 that extends from the first connection pad 141 to the second connection pad 142 is formed, so as to perform the erasing operation (i.e. set operation) on the resistance memory cell 800.

It is noted that the bridge portions 142 of FIG. 1 and FIG. 8 are both connected between the connection pads 141 and 143, and the second current paths PT12 both extend from the first connection pad 141 to the second connection pad 142. Therefore, in actual operation, the second current path PT12 passes through the bridge portion 142 but does not pass through the tungsten metal layer 120 and the metal oxide layer 130. Because the second current path PT12 does not pass through the metal oxide layer 130, the resistance memory cells 100 and 800 are not affected by current stress during the erasing even when the storage status of the memory cell is switched by the operation mode of unipolar switching. Consequently, device degradation is prevented and reliability of the memory is enhanced.

In addition, under the operation mode of bipolar switching, only the first current path PT11 passes through the metal oxide layer 130 and the tungsten metal layer 120 in the resistance memory cells 100 and 800. Thus, a switch composed of a diode may be used to control a timing of switching the storage status of the resistance memory cells 100 and 800. In comparison with the conventional technology, the embodiments of the invention do not require a switch composed of transistors to control the resistance memory cells, and thus is conducive to reducing the layout area of the memory array composed of a plurality of the resistance memory cells 100 or 800, thereby achieving a high-density memory array.

Figure 11:
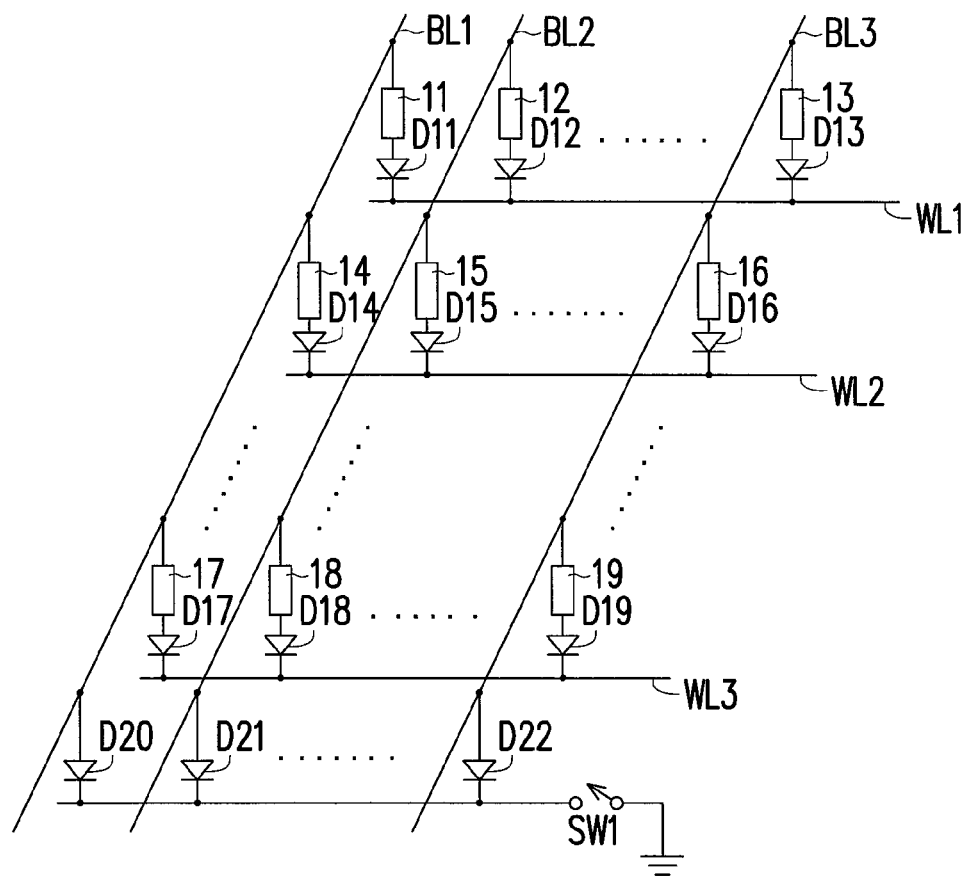
FIG. 11 is a schematic diagram illustrating a memory array according to an exemplary embodiment of the invention.

For example, FIG. 11 is a schematic diagram illustrating a memory array according to an exemplary embodiment of the invention. As shown in FIG. 11, the memory array includes a plurality of resistance memory cells 11-19, a plurality of diodes D11-D22, a switch SW1, a plurality of bit lines BL1-BL3, and a plurality of word lines WL1-WL3. More specifically, one resistance memory cell and one diode are connected in series between one bit line and one word line, so as to form a basic structure of one diode and one resistor (1D1R). For instance, the resistance memory cell 11 and the diode D11 are connected in series between the bit line BL1 and the word line WL1.

In actual application, each of the resistance memory cells 11-19 may be the resistance memory cell 100 of FIG. 1 or the resistance memory cell 800 of FIG. 8. When a plurality of the resistance memory cells 100 are used to form the memory array, the second electrode 140 of each of the resistance memory cells 100 is a part of the corresponding bit line. Moreover, when a plurality of the resistance memory cells 800 are used to form the memory array, the third electrode 810 is electrically connected with the first connection pad 141 in each of the resistance memory cells 800, and the second electrode 140 of each of the resistance memory cells 800 is a part of the corresponding bit line.

In terms of writing data, the erasing operation can be performed entirely on the resistance memory cells 11-19 of the memory array first to set the storage status of all the resistance memory cells 11-19 to the low resistance state (e.g. logic 0). For the erasing operation of the memory array, for instance, an end of each of the bit lines BL1-BL3 is used for receiving the erasing pulse $V_{SET}$. Besides, the switch SW1 is turned on, such that the other end of each of the bit lines BL1-BL3 is electrically connected to the ground end via the diodes D20-D22. Accordingly, the resistance memory cells 11-19 are set to the low resistance state.

Then, the plurality of resistance memory cells, needed to be reset to the high resistance state (e.g. logic 1), are sequentially programmed. For example, in the case that the storage status of the resistance memory cell 11 is needed to be reset to the high resistance state, the bit line BL1 is used for receiving the programming pulse $V_{RESET}$, and the word line WL1 is electrically connected to the ground end. In the actual operation, an unnecessary leakage path may be formed between the bit lines BL1-BL3. In order to avoid such a situation, the switch SW1 is turned off in the programming operation, such that the diodes D20-D22 cannot be turned on. Accordingly, the leakage path between the bit lines BL1-BL3 may be isolated.

In conclusion of the above, the invention uses the second electrode in the resistance memory cell to form the second current path that does not pass through the metal oxide layer. Accordingly, the first current path that passes through the metal oxide layer is used to reset the metal oxide layer to the high resistance state and the second current path that does not pass through the metal oxide layer is used to set the metal oxide layer to the low resistance state. Since the second current path does not pass through the metal oxide layer, device degradation is prevented and reliability of the memory is improved. In addition, the resistance memory cell of the invention is applicable to the formation of the memory array with basic structure of 1D1R and is conducive to fabricating the high-density memory array.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A resistance memory cell, comprising:
   a first electrode;
   a tungsten metal layer disposed on the first electrode;
   a metal oxide layer disposed on the tungsten metal layer; and
   a second electrode comprising a first connection pad, a second connection pad, and a bridge portion electrically connected between the first connection pad and the second connection pad, and the bridge portion being disposed on the metal oxide layer or surrounding the metal oxide layer, wherein the resistance memory cell adjusts a resistivity of the metal oxide layer through a first current path, passing through the metal oxide layer and the tungsten metal layer, or a second current path extending from the first connection pad to the second connection pad.

2. The resistance memory cell according to claim 1, wherein the resistance memory cell increases the resistivity of the metal oxide layer through the first current path.

3. The resistance memory cell according to claim 1, wherein the resistance memory cell generates a heat source through the second current path and reduces the resistivity of the metal oxide layer by the heat source.

4. The resistance memory cell according to claim 1, wherein when the bridge portion is disposed on the metal oxide layer, the first connection pad is used for receiving a programming pulse or an erasing pulse, and one of the first electrode and the second connection pad is electrically connected to a ground end.

5. The resistance memory cell according to claim 4, wherein when the first electrode is electrically connected to the ground end, the first connection pad is used for receiving the programming pulse; and when the second connection pad is electrically connected to the ground end, the first connection pad is used for receiving the erasing pulse.

6. The resistance memory cell according to claim 1, wherein when the bridge portion surrounds the metal oxide layer, the resistance memory cell further comprises:
   a connection layer disposed on the metal oxide layer, and the metal oxide layer being disposed in an opening of the bridge portion; and
   a third electrode disposed on the connection layer.

7. The resistance memory cell according to claim 6, wherein when the first electrode is electrically connected to the ground end, the third electrode is used for receiving the programming pulse.

8. The resistance memory cell according to claim 6, wherein when the second connection pad is electrically connected to the ground end, the first connection pad is used for receiving the erasing pulse.

* * * * *